(12) United States Patent
Chen et al.

(10) Patent No.: US 9,252,023 B2
(45) Date of Patent: Feb. 2, 2016

(54) ETCHING METHOD AND APPARATUS

(75) Inventors: Shih-Hung Chen, Zhubei (TW); Chien-An Chen, Hsin-Chu (TW); Ying Xiao, Zhubei (TW); Ying Zhang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1126 days.

(21) Appl. No.: 13/234,975

(22) Filed: Sep. 16, 2011

(65) Prior Publication Data

US 2013/0072013 A1 Mar. 21, 2013

(51) Int. Cl.
*H01L 21/44* (2006.01)
*H01L 21/311* (2006.01)
*H01L 21/768* (2006.01)

(52) U.S. Cl.
CPC .... *H01L 21/31138* (2013.01); *H01L 21/31116* (2013.01); *H01L 21/76802* (2013.01)

(58) Field of Classification Search
CPC ............... H01L 21/31116; H01L 21/31138
USPC ..................................................... 438/652
See application file for complete search history.

(56) References Cited

U.S. PATENT DOCUMENTS

| 7,140,374 B2 | 11/2006 | Bailey, III et al. | |
|---|---|---|---|
| 2001/0008226 A1 | 7/2001 | Hung et al. | |
| 2003/0000923 A1* | 1/2003 | Ko et al. | 216/61 |
| 2003/0170978 A1* | 9/2003 | Lee | 438/638 |
| 2005/0093012 A1* | 5/2005 | Bailey et al. | 257/100 |

FOREIGN PATENT DOCUMENTS

| CN | 101421056 A | 4/2009 |
|---|---|---|
| KR | 100430046 | 5/2004 |
| KR | 100951475 B1 | 4/2010 |
| TW | 451446 B | 8/2001 |
| WO | 0030168 A1 | 5/2000 |

* cited by examiner

*Primary Examiner* — Bradley K Smith
(74) *Attorney, Agent, or Firm* — Slater & Matsil, L.L.P.

(57) ABSTRACT

An etching method comprises etching an oxide layer with a first dc bias of a plasma chamber, removing a photoresist layer with a second dc bias of the plasma chamber and etching through a liner film with a third dc bias of the plasma chamber. In order to reduce the copper deposition on the wall of the plasma chamber, the third dc bias is set to be less than the first and second dc bias.

19 Claims, 7 Drawing Sheets

ETCHING METHOD AND APPARATUS

BACKGROUND

Since the invention of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards the sub-20 nm node). As the demand for miniaturization continues, the further shrinking of the process node may increase the complexity of fabricating integrated circuits.

As semiconductor technologies evolve, semiconductor fabrication processes have become more sophisticated and hence require complex equipment and fixtures. In the semiconductor process, integrated circuits are fabricated on a semiconductor wafer. The semiconductor wafer goes through many processing steps before a plurality of integrated circuits are separated by cutting the semiconductor wafer. The processing steps may include lithography, etching, doping and depositing different materials.

Etching is a processing step by which one or several layers can be removed from a wafer. There are two types of etching: wet etching and dry etching. Wet etching is an etching process that utilizes liquid chemicals to remove materials on top of a wafer. On the other hand, dry etching is an etching process that uses either plasma and/or reactive gases to remove materials from the wafer. Generally, a semiconductor wafer may go through many etching steps before the etching process is complete. Such etching steps include nitride etch, poly etch, spacer etch, contact etch, via etch, metal etch and the like.

Plasma is an ionized gas, which generates ions. The strength of ion bombardment is mainly determined by a dc bias of a plasma chamber. The dc bias is approximately proportional to the amplitude of a radio frequency (RF) power source used to power the plasma chamber. In a dry etching process, in order to control the etching rate, for example reducing the etching rate of a plasma chamber, the amplitude of the RF power source is reduced so that the dc bias of the plasma chamber is reduced too. As a result, the ion bombardment energy is reduced too. Such a reduction of the ion bombardment energy will reduce the etching rate of a wafer placed in the plasma chamber.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a copper self-clean mechanism in a passivation etching process. The invention may also be applied, however, to a variety of etching processes.

Figure 1:
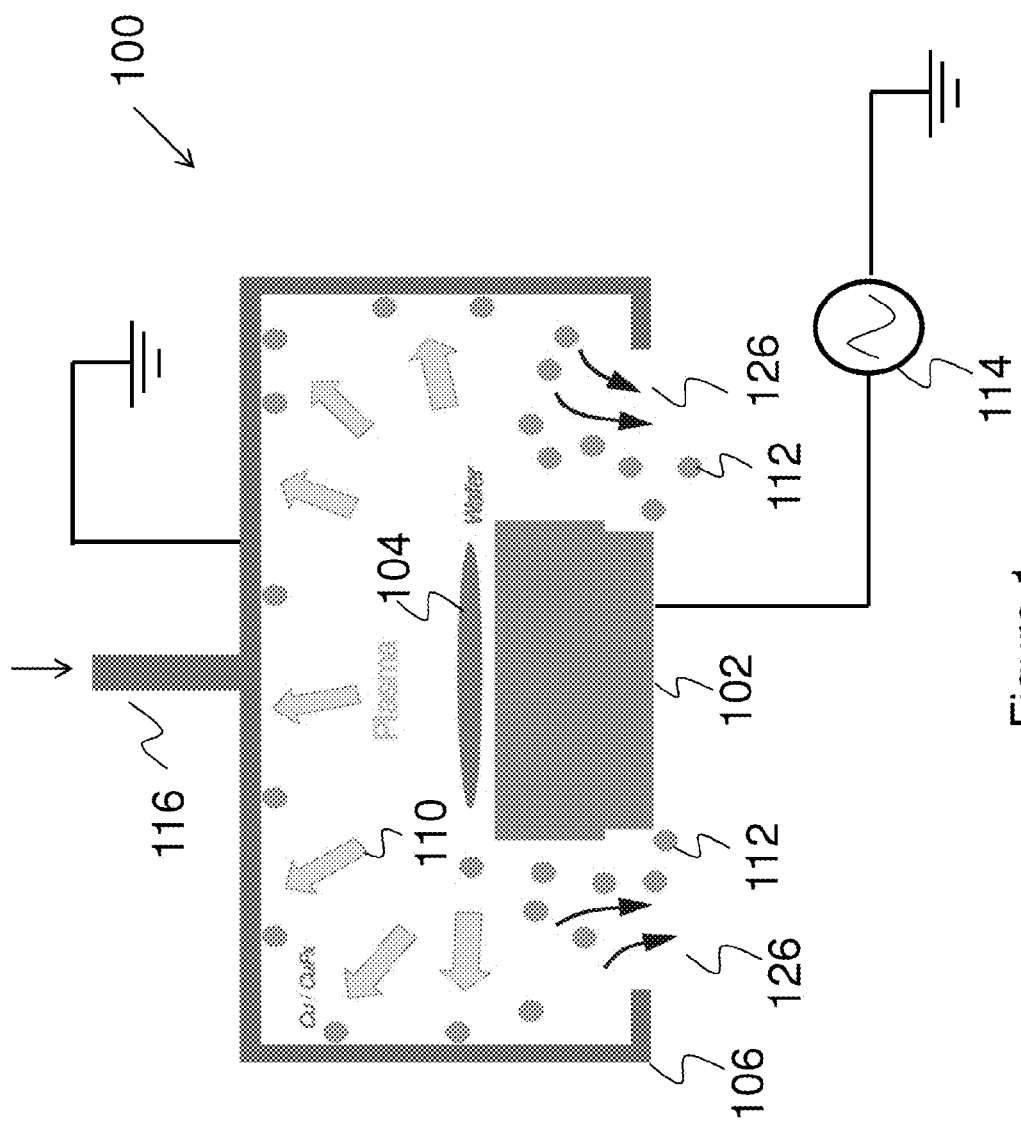
FIG. 1 illustrates a schematic configuration of a plasma chamber in accordance with an embodiment.

Referring initially to FIG. 1, a schematic configuration of a plasma chamber is illustrated in accordance with an embodiment. As shown in FIG. 1, a wafer 104 is placed on a chuck 102 of a plasma chamber 100. In accordance with an embodiment, the plasma chamber 100 may employ an etching mechanism called reactive ion etch (RIE). As required by RIE, a variety of gases are supplied from an inlet 116. Through an ionization process, plasma 110 comprising a plurality of ions is generated in the plasma chamber 110.

The plasma chamber 100 comprises two electrodes. As shown in FIG. 1, the wall of the plasma chamber 100 is used as a first electrode, which is connected to ground. A chuck 102 of the plasma chamber 100 is used as a second electrode, which is powered by a radio frequency (RF) power source 114. The first electrode and the second electrode form an electrical field, through which the ions of the plasma 110 are accelerated. During an etching process, the accelerated ions hit the surface of the wafer 104. As a result, the atoms on the unprotected surface of the wafer 104 are dislodged so that a portion of the wafer 104 is removed.

It should be noted that while FIG. 1 shows a single RF power source 114, the RF power source 114 may include two separate RF sources, namely a high frequency RF source and a low frequency RF source. The high frequency RF source (not shown) is used to dissociate the gases so as to generate the plasma 110. On the other hand, the low frequency RF source (not shown) is mainly used to accelerate the ions of the plasma 110 so that the ion bombardment energy of the plasma 110 can be adjusted to a level suitable for the etching processes for different semiconductor layers.

When the plasma density is fixed, the etching rate is approximately proportional to the strength of ion bombardment energy. As shown in FIG. 1, the RF power source 114 is inductively coupled to the plasma 110 of the plasma chamber 100. As described above, the low frequency RF power source is used to adjust the strength of the ion bombardment energy. In order to adjust the etching rate, the amplitude of the low frequency RF power source may be adjusted accordingly. In response to the amplitude change of the low frequency RF power source, the dc bias of the plasma 110 changes too. An increased dc bias of the plasma 110 may increase the ion bombardment energy of the plasma 110. On the other hand, a reduced dc bias of the plasma 110 may lower the ion bombardment energy of the plasma 110.

The plasma chamber 100 may further comprise a plurality of outlets such as outlet 126. In an etching process, a large amount of byproduct gas may be generated. In addition, some Cu, CuFx or CuOx particles may be generated during erosion of the copper layer of the wafer 104. Such byproducts may be removed continuously by vacuum pumps (not shown) through the outlet 126.

Figure 2:
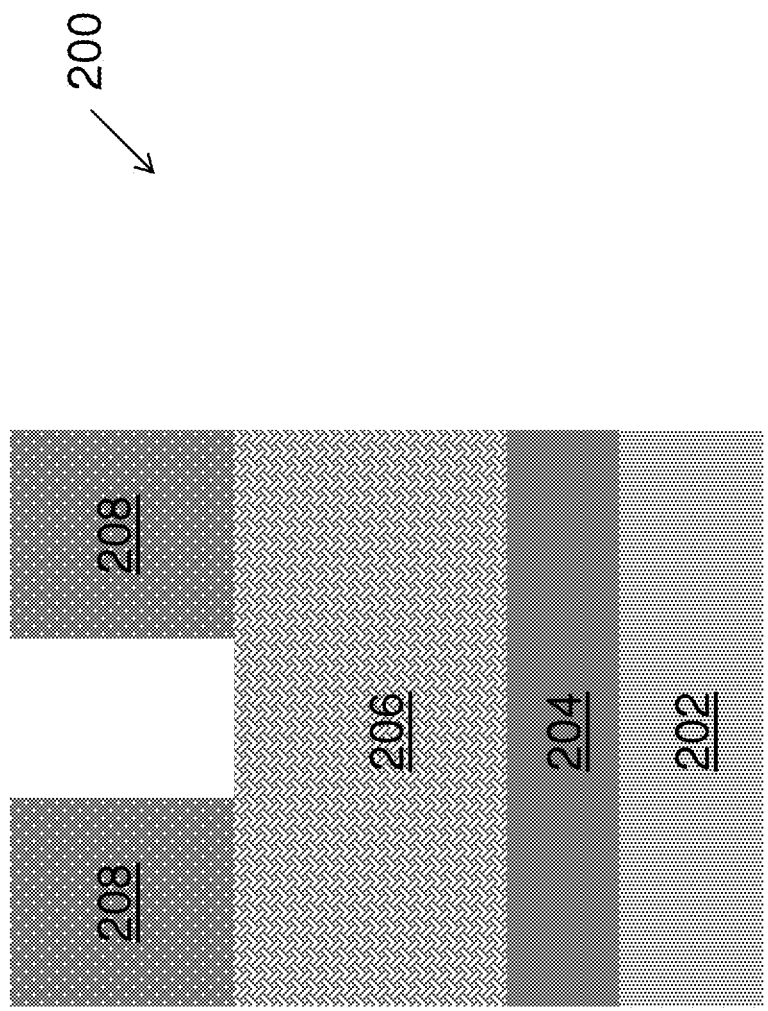
FIG. 2 illustrates a cross sectional view of a layer stack including a copper layer in accordance with an embodiment.

FIG. 2 illustrates a cross sectional view of a layer stack including a copper layer in accordance with an embodiment. The layer stack 200 may comprise four layers. A copper layer 202 may be used as copper interconnects of an integrated circuit in accordance with an embodiment. In order to prevent the copper layer 202 from being damaged by the plasma, a liner film 204 is formed on top of the copper layer 202. For example, the thickness of the liner film 204 is in a range about 300 angstroms to about 3000 angstroms. The liner film 204 may be formed of silicon nitrides, silicon oxynitride or the like. In accordance with an embodiment, the liner film 204 is deposited on the copper layer 202 using a chemical vapor deposition (CVD) process. The liner film 204 may be of a thickness less than 1 um.

FIG. 2 further illustrates an oxide layer 206 formed on top of the liner film 204. The oxide layer 206 is formed of a material such as silicon dioxide. In accordance with an embodiment, the oxide layer 206 is of a thickness less than 5 um. Alternately, the thickness of the oxide layer 206 is in a range about 5000 angstroms to about 12000 angstroms. A photoresist layer 208 is first formed on top of the oxide layer 206. Subsequently, the photoresist layer 208 is processed to form the pattern of openings using a photo-lithographical process. In accordance with an embodiment, the photoresist layer 208 is of a thickness less than 10 um. As shown in FIG. 2, a portion of the photoresist layer 208 is stripped after the photo-lithographical process. The remaining portions of the photoresist layer 208 form a mask to facilitate the subsequent etching processes.

Figure 3:
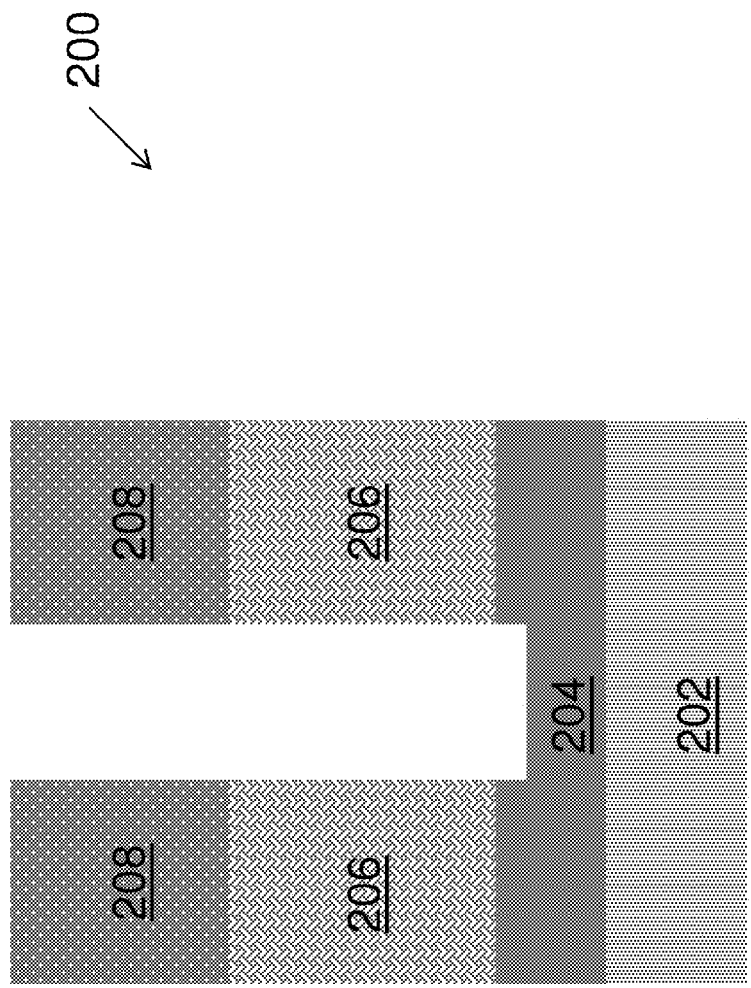
FIG. 3 illustrates a layer stack following an oxide layer etching process in accordance with an embodiment.

FIG. 3 illustrates a layer stack following an oxide layer etching process. In accordance with an embodiment, a RIE process is employed to remove the unprotected portion of the oxide layer 206. In accordance with an embodiment, the gas in the RIE process includes CF4, CHF3, CH2F2, C4F8, Ar, O2, N2 and/or the like. The pressure of the RIE process is in a range about 30 mTorr to about 200 mTorr. The temperature of the RIE process is in a range about 5 degrees to about 50 degrees.

The plasma of the RIE process may dislodge the atoms on the unprotected portion of the oxide layer 206. At the same time, the plasma of the RIE process may dislodge copper or copper compounds deposited on the wall of the plasma chamber 100 (not shown). The dislodged copper or copper compounds are removed from the plasma chamber by vacuum pumps (not shown) through the outlet 126 shown in FIG. 1. In accordance with an embodiment, the dc bias of the plasma is increased in this RIE process so that the ion bombardment energy is increased proportionally. As a result, the copper or copper compounds deposited on the wall of the plasma chamber 100 through a previous etching process of a copper layer 202 may be removed. The etching process of the copper layer 202 will be discussed in further detail with respect to FIG. 5.

Figure 4:
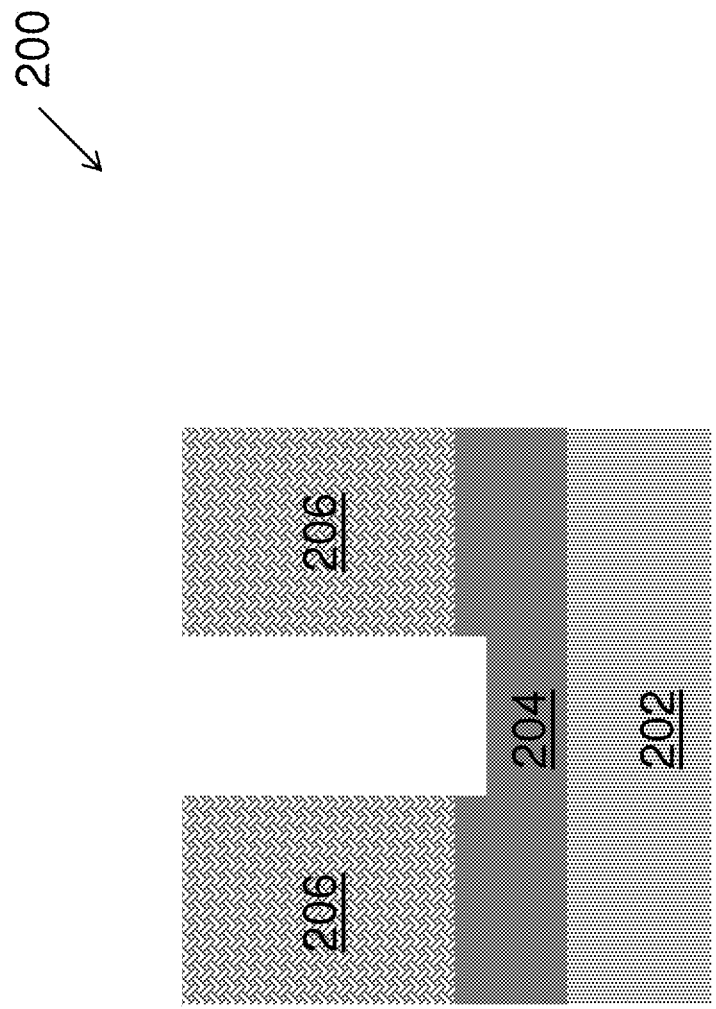
FIG. 4 illustrates a layer stack following a photoresist layer strip process using a plasma ash process.

FIG. 4 illustrates a layer stack following a photoresist layer strip process using a plasma ash process. In accordance with an embodiment, various gases such as O2, N2, CF4 and the like are supplied to generate a reactive species using the plasma 110 (not shown but illustrated in FIG. 1). The pressure of the plasma ash process is in a range about 0.1 to 2 Torr. The temperature of the plasma ash process is in a range about 5 degrees to 90 degrees. The reactive species interacts with the photoresist layer 208 to form ash, which is stripped away from the layer stack. Furthermore, various vacuum pumps (not shown) may be employed to remove the ash from the plasma chamber 100. Similar to the oxide layer etching process described with respect to FIG. 3, the dc bias of the plasma 110 is increased in this photoresist ash process so that the ion bombardment energy is increased proportionally. As a result, the remaining copper or copper compounds formed on the wall of the plasma chamber 100 may be dislodged so that a self-clean process can be achieved. One advantageous feature of increasing the dc bias of the plasma 110 during the etching processes described above with respect to FIG. 3 and FIG. 4 is that the increased ion bombardment energy helps to prevent the copper accumulation on the wall of the plasma chamber 100. Furthermore, the self-clean process may improve the plasma chamber's stability so that a single plasma chamber (e.g., plasma chamber 100) may satisfy three different steps of a passivation etching process.

Figure 5:
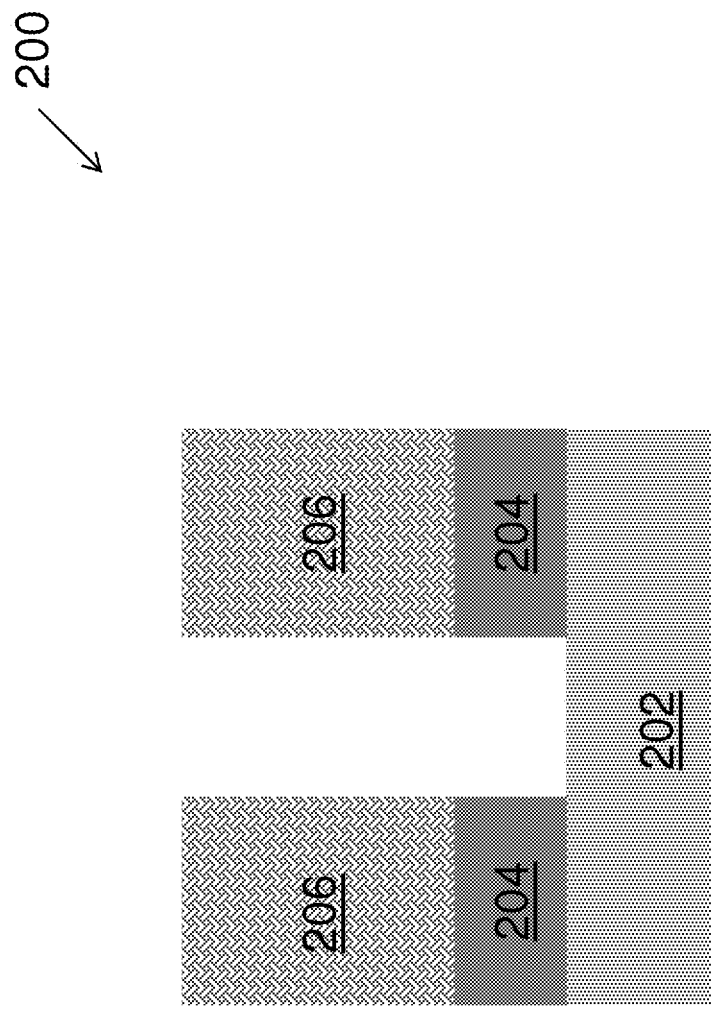
FIG. 5 illustrates a layer stack following a liner film opening process in accordance with an embodiment.

FIG. 5 illustrates a layer stack following a liner film opening process in accordance with an embodiment. In accordance with an embodiment, the gas of the liner film opening process includes CF4, CHF3, C4F8, Ar, O2, N2 and/or the like. The pressure of the liner film opening process is in a range about 30 mTorr to about 200 mTorr. The temperature of the liner film opening process is in a range about 5 degrees to 50 degrees. During a liner film opening process, the plasma 110 may be employed to etch through the liner film 204. As a result, the copper layer 202 is exposed to air. In order to fully remove the unprotected portion of the liner film 204, the plasma 110 may touch the surface of the copper layer 202. Consequently, a plurality of copper atoms may be dislodged and sputtered away from the surface of the copper layer 202. The sputtered copper atoms may be deposited on the wall of the plasma chamber 100. In order to reduce the number of copper atoms dislodged from the surface of the copper layer 202, in accordance with an embodiment, the dc bias of the plasma is reduced by approximately 80% in comparison with the dc bias of the plasma used in the plasma etching steps shown in FIG. 3 and FIG. 4. An advantageous feature of reducing the dc bias of the plasma as well as the ion bombardment energy during the liner opening processes is that the reduced ion bombardment energy helps to prevent the copper atoms from being dislodged from the surface of the copper layer 202. As a result, a self-clean process of the wall of the plasma chamber can be implemented with minimal effort using an increased dc bias in the first two steps of the passivation etching process of a subsequent wafer placed in the plasma chamber 100. It should be noted that that a reduced dc bias used in the previous example are selected purely for demonstration purposes and are not intended to limit the various embodiments. One skilled in the art will recognize that changing the dc bias of a plasma chamber is simply one manner of reduce the ion bombardment energy and that other and alternate embodiments could be employed (such as increasing the pressure of the plasma chamber 100 so as to reduce the ion bombardment energy).

Figure 6:
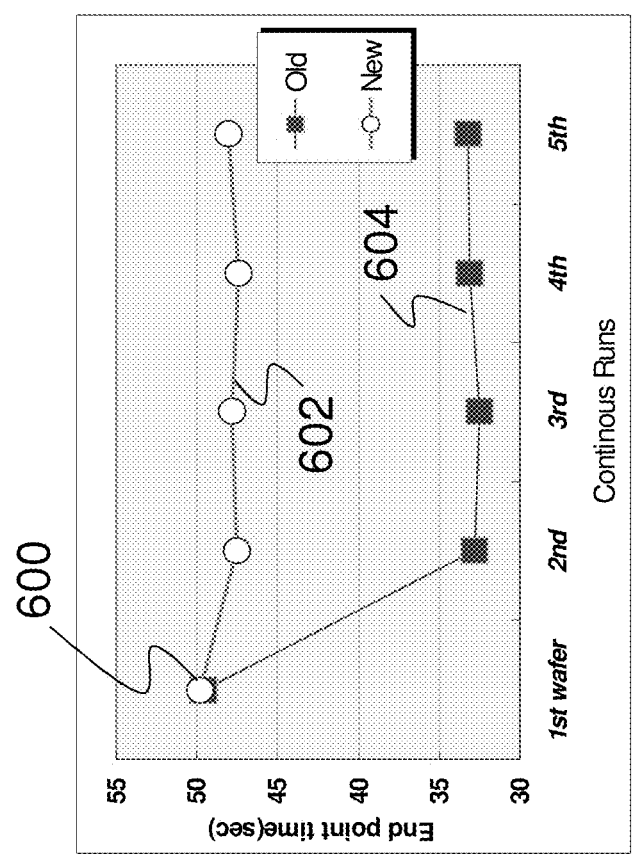
FIG. 6 illustrates the oxide layer etching time difference between a plasma chamber based upon a conventional technique and a plasma chamber employing the copper self-clean process described above.

FIG. 6 illustrates the oxide layer etching time difference between a plasma chamber based upon a conventional technique and a plasma chamber employing the copper self-clean process described above. The horizontal axis of FIG. 6 represents different runs of a plasma chamber. The vertical axis of FIG. 6 represents the total etching time of the oxide layer 206. A curve 604 illustrates the etching time of the oxide layer 206 in different runs of the plasma chamber using a conventional technique. A square on the curve 604 indicates a corresponding wafer run of the plasma chamber at the horizontal axis and a corresponding etching time of the oxide layer 206 at the vertical axis. In contrast, a curve 602 illustrates the etching time of the oxide layer 206 in different runs of the plasma chamber using the copper self-clean technique.

As shown in FIG. 6, in the first run of the plasma chamber, both the curve 602 and the curve 604 indicate the same oxide layer etching time. In accordance with an embodiment, the oxide layer etching time for the first run is approximately 50 seconds as indicated by a point 600. A person having ordinary skill in the art will recognize that there may be no significant difference between two curves because both curves are based upon a clean plasma chamber. However, the second run the subsequent runs show the copper self-clean technique helps to stabilize the oxide layer etching time. More particularly, the curve 602 shows the oxide layer etching time variations during different runs are less than 5%. In contrast, the curve 604 shows the copper deposition on the wall of the plasma chamber may speed up the oxide layer etching rate. As a result, the oxide layer etching times of the second run and the subsequent runs are reduced to approximately 35. An advantageous feature of the described embodiment is the copper self-clean process helps to stabilize the etching rate of the oxide layer so that a better etching surface uniformity can be achieved. Another advantageous feature of the described embodiment is that the oxide layer etching rate can be used as a copper accumulation index to control the dc bias of the copper self-clean process.

Figure 7:
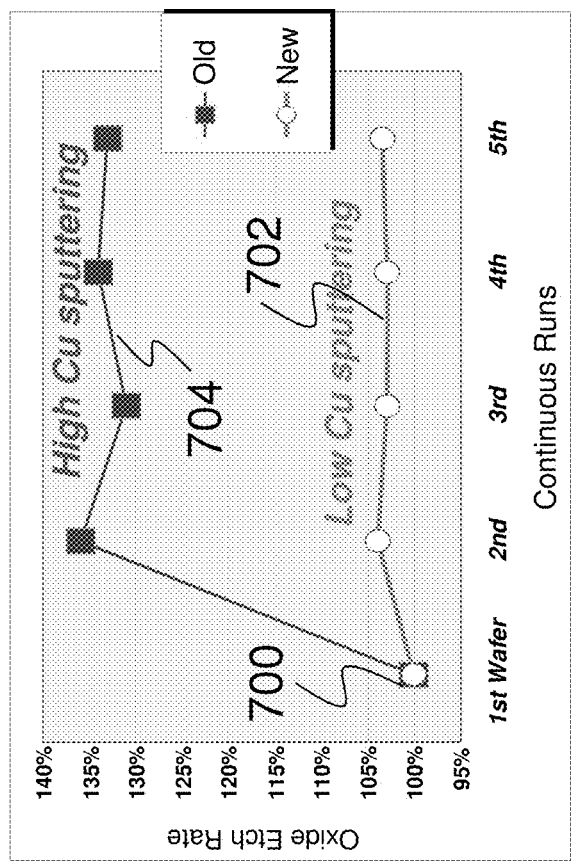
FIG. 7 illustrates the oxide layer etching time difference between a plasma chamber based upon a conventional technique and a plasma chamber employing the copper self-clean process described above.

FIG. 7 illustrates the oxide layer etching rate difference between a plasma chamber based upon a conventional technique and a plasma chamber employing the copper self-clean process described above. The horizontal axis of FIG. 7 represents different runs of a plasma chamber. The vertical axis of FIG. 7 represents the oxide layer etching rate. A curve 704 illustrates the etching rate of the oxide layer 206 in different runs of the plasma chamber using a conventional technique. In contrast, a curve 702 illustrates the etching rate of the oxide layer 206 in different runs of the plasma chamber using the copper self-clean technique.

Similar to that shown in FIG. 6, in the first run of the plasma chambers, there may be no difference between two plasma chambers based upon different techniques. However, the second run and the subsequent runs show the copper self-clean technique helps to achieve a stable oxide layer etching rate. More particularly, the curve 702 shows the oxide layer etching rate remains with approximately 100%, which represents a normal oxide layer etching rate. In contrast, the curve 704 shows the copper deposition on the wall of the plasma chamber may speed up the oxide layer etching rate. As a result, the oxide layer etching rate may be increased by approximately 35%. In sum, by employing the copper self-clean mechanism, a plasma chamber can be used in different steps of a passivation etching process. Furthermore, the self-clean technique may help to improve the oxide layer etching rate as well as the surface uniformity during various etching steps.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a liner film on a copper layer;
   forming an oxide layer on the liner film;
   forming a photoresist layer on the oxide layer;
   etching the oxide layer in a plasma tool, the plasma tool having a radio frequency power source configured to generate a first dc bias of a plasma chamber;
   removing the photoresist layer in the plasma tool, wherein the radio frequency power source is configured to generate a second dc bias of the plasma chamber; and
   etching through the liner film in the plasma tool with the radio frequency power source configured to generate a third dc bias of the plasma chamber, wherein prior to the step of etching through the liner film, a bottom surface of the liner film is in direct contact with a copper surface.

2. The method of claim 1, further comprising:
   configuring the first dc bias of the plasma chamber and the third dc bias of the plasma chamber such that the third dc bias of the plasma chamber is less than the first dc bias of the plasma chamber.

3. The method of claim 1, further comprising:
   configuring the second dc bias of the plasma chamber and the third dc bias of the plasma chamber such that the third dc bias of the plasma chamber is less than the second dc bias of the plasma chamber.

4. The method of claim 1, further comprising:
   reducing a pressure level of the plasma chamber during the step of etching through the liner film.

5. The method of claim 1, further comprising:
   dislodging copper particles deposited on a wall of the plasma chamber; and
   removing the copper particles from the plasma chamber using vacuum pumps.

6. The method of claim 1, further comprising:
   reducing sputtered copper atoms from a copper layer using a reduced dc bias plasma etching process.

7. A method comprising:
   forming a copper layer;
   forming a liner film on the copper layer;
   forming an oxide layer on the liner film;
   forming a photoresist layer on the oxide layer;
   removing the oxide layer using a first plasma etching process generated with a first plasma dc bias voltage in a plasma chamber;
   removing the photoresist layer using a plasma ash process generated with a second plasma dc bias voltage in the plasma chamber; and
   etching through the liner film using a second plasma etching process generated with a third plasma dc bias voltage in the plasma chamber.

8. The method of claim 7, further comprising:
   configuring the first plasma dc bias voltage and the third plasma dc bias voltage such that the first plasma dc bias voltage is greater than the third plasma dc bias voltage.

9. The method of claim 7, further comprising:
   configuring the second plasma dc bias voltage and the third plasma dc bias voltage such that the second plasma dc bias voltage is greater than the third plasma dc bias voltage.

10. The method of claim 7, further comprising:
reducing the third plasma dc bias voltage by 80% in comparison with the first plasma dc bias voltage.

11. The method of claim 7, further comprising:
removing passivation etching byproducts from the plasma chamber using a vacuum pump.

12. The method of claim 7, further comprising:
removing copper particles from a wall of the plasma chamber; and
removing copper compounds from the wall of the plasma chamber.

13. A method comprising:
placing a wafer in a plasma chamber, wherein the wafer comprising a copper layer, a liner layer over the copper layer, an oxide layer over the liner layer and a photo resist layer over the oxide layer;
patterning the photo resist layer;
etching through the oxide layer using a first reactive ion etch process, wherein the first reactive ion etch process has a first dc bias; and
etching through the liner layer using a second reactive ion etch process, wherein the second reactive ion etch process has a second dc bias, and wherein the first dc bias is approximately five times higher than the second dc bias.

14. The method of claim 13, further comprising:
after the step of etching through the oxide layer using the first reactive ion etch process, removing the photo resist layer through a plasma ash process, wherein the plasma ash process has a third dc bias.

15. The method of claim 14, further comprising:
the third dc bias is approximately five times higher than the second dc bias.

16. The method of claim 14, further comprising:
dislodging copper compounds deposited on a wall of the plasma chamber through increasing the third dc bias of the plasma ash process.

17. The method of claim 13, further comprising:
dislodging copper compounds deposited on a wall of the plasma chamber through increasing the first dc bias of the first reactive ion etch process.

18. The method of claim 17, further comprising:
removing the copper compounds from the plasma chamber using vacuum pumps.

19. The method of claim 13, further comprising:
reducing sputtered copper atoms from the copper layer through reducing the second dc bias.

* * * * *